United States Patent [19]

Theus et al.

[11] Patent Number: 5,072,369
[45] Date of Patent: Dec. 10, 1991

[54] INTERFACE BETWEEN BUSES ATTACHED MODULES INTERFACE BETWEEN PROVIDING ADDRESS SPACE MAPPED CACHE COHERENT MEMORY ACCESS WITH SNOOP HIT MEMORY UPDATES

[75] Inventors: John G. Theus, Sherwood; Jeffrey L. Beachy, Wilsonville, both of Oreg.

[73] Assignee: Tektronix, Inc., Beaverton, Oreg.

[21] Appl. No.: 335,173

[22] Filed: Apr. 7, 1989

[51] Int. Cl.$^5$ .................... G06F 12/08; G06F 12/10; G06F 13/16

[52] U.S. Cl. .............................. 395/425; 364/243.41; 364/255.7; 364/240.2; 364/955.5; 364/964.32; 364/964.342; 364/DIG. 1; 364/DIG. 2

[58] Field of Search .......... 364/200 MS File, 900 MS File37

[56] References Cited

U.S. PATENT DOCUMENTS

| | | | |
|---|---|---|---|
| 4,025,365 | 6/1991 | Mathur et al. | 364/200 |
| 4,747,043 | 5/1988 | Rodman | 364/200 |
| 4,754,394 | 6/1988 | Brantley, Jr. et al. | 364/200 |
| 4,755,930 | 7/1988 | Wilson, Jr. et al. | 364/200 |
| 4,785,395 | 11/1988 | Keeley | 364/200 |
| 5,008,813 | 4/1991 | Crane et al. | 364/200 |
| 5,029,070 | 7/1991 | McCarthy et al. | 364/200 |

Primary Examiner—Thomas C. Lee
Assistant Examiner—Ken S. Kim
Attorney, Agent, or Firm—John P. Dellett; Daniel J. Bedell

[57] ABSTRACT

An interface circuit permits a first bus master connected to a first bus to directly access a main memory connected to a second bus while maintaining coherency between corresponding data in the main memory and a cache memory used by a second bus master on the second bus. The interface circuit maps selected first bus addresses to corresponding second bus addresses such that when a bus master on the first bus attempts to read or write access one of the mapped first bus addresses, the bus interface circuit responds by read or write accessing a corresponding address in the memory on the second bus. The bus interface circuit stores SNOOP data indicating which memory addresses contain data cached in the cache memory, and when accessing a cached memory address, the bus interface circuit places a signal on the second bus telling the second bus master to copy data from the cache memory into the main memory before the interface circuit performs a main memory read access or to copy data from the main memory to the cache memory after the interface circuit completes a main memory write access, thereby to maintain coherency between the main memory and the cache memory.

3 Claims, 6 Drawing Sheets

INTERFACE BETWEEN BUSES ATTACHED MODULES INTERFACE BETWEEN PROVIDING ADDRESS SPACE MAPPED CACHE COHERENT MEMORY ACCESS WITH SNOOP HIT MEMORY UPDATES

BACKGROUND OF THE INVENTION

The present invention relates in general to interface circuits providing communication between computer systems and in particular to an interface circuit permitting a bus master connected to one computer bus to directly access data stored in a memory connected to another bus.

In some applications, several computer processors are interconnected so that they may communicate with each other as when one computer processor generates data for use by another. Some systems connect the computer processors to the same parallel computer bus and allow them to arbitrate for mastery of the bus, thereby to access the same main memory. In such systems, one processor may pass data to another by writing data to a main memory location read accessible to the other. To provide faster memory access, a computer processor on the bus may copy a block of data from an area of the low speed main memory into a higher speed cache memory and thereafter read and write access the data in the cache memory rather than in main memory. However, if another computer processor on the bus subsequently read accesses the same area of main memory, data read may be "obsolete" because it was not updated when corresponding data stored in cache memory was updated. Also, if another computer processor on the bus writes data to the area of main memory, corresponding data in cache memory becomes obsolete.

In the standard IEEE 896 bus (the "Futurebus"), to ensure coherency between corresponding data in the cache and main memory, when a first bus master seeks to read access a main memory address, it may assert a "SNOOP" signal on the Futurebus during the bus address cycle. If a second bus master on the Futurebus is using a cache memory for data stored at that memory address, the second bus master may assert a "retry" signal, causing the first bus master to relinquish control of Futurebus before completing the address cycle. At that point, the second bus master obtains control of the Futurebus and writes the appropriate data from cache memory back into main memory. Thereafter, when the first bus master again attempts to access the data in the main memory, the second bus master ignores the SNOOP signal and permits the first bus master to complete both address and data cycles.

When various computer processors employ differing parallel buses, it is not possible to directly connect the computer processors to the same bus. In such case, the processors must operate within separate computer systems utilizing separate buses and accessing separate local memories. Typically, each computer system includes one or more ports connected to its bus. The ports of the separate computers are interconnected so that when a first computer reads data out of its local memory and writes the data to its port, that port signals a port of a second computer that it has data to transfer. The port of the second computer then signals a computer processor within the second computer that incoming data is available. The second computer processor then obtains the data via the second computer port and stores the data in its local memory, the second computer exercising normal second bus protocol, if any, for maintaining cache consistency. However, the process of transferring data from a memory location on the first bus to a memory location on the second bus is slow because it requires several bus cycles and ties up processors in both systems.

SUMMARY OF THE INVENTION

An interface circuit provides data communication between buses of two computer systems. In the preferred embodiment, one computer system uses the well-known VMEbus and the other computer system uses the Futurebus. In accordance with an aspect of the invention, the interface circuit includes a mapping circuit that maps each of a set of VMEbus addresses to corresponding Futurebus addresses. When a computer processor on the VMEbus attempts to read or write access any one of the set of VMEbus addresses, the mapping circuit generates a corresponding Futurebus address and a SNOOP signal indicating whether the Futurebus address references a cached data storage location on the Futurebus. The bus interface circuit then obtains control of the Futurebus and starts a read or write access cycle by placing the SNOOP signal and the generated address on the Futurebus. If the SNOOP signal indicates the Futurebus address references a cached data storage location, another computer processor on the Futurebus controlling the cache responds to the SNOOP signal with a retry signal. The bus interface circuit then relinquishes control of the Futurebus to the other computer processor to permit the other computer processor to write data from the cache into the storage location referenced by the generated Futurebus address. Thereafter, the interface circuit regains control of the Futurebus and completes a read or write access of that data storage location.

In accordance with another aspect of the invention, the interface circuit permits a computer processor on the Futurebus to write mapping data into the mapping circuit to selectively alter the Futurebus address and SNOOP signal state generated by the mapping circuit in response to any particular VMEbus address.

It is accordingly an object of the invention to permit a computer processor connected to a first bus to directly access a memory connected to a second bus while permitting a processor on the second bus to maintain coherency between corresponding data in the memory and a cache used by the processor on the second bus.

The concluding portion of this specification particularly points out and distinctly claims the subject matter of the present invention. However, those skilled in the art will best understand both the organization and method of operation of the invention, together with further advantages and objects thereof, by reading the following description taken in view of the accompanying drawings wherein like reference characters refer to like elements.

DESCRIPTION OF THE PREFERRED EMBODIMENT

Figure 1:
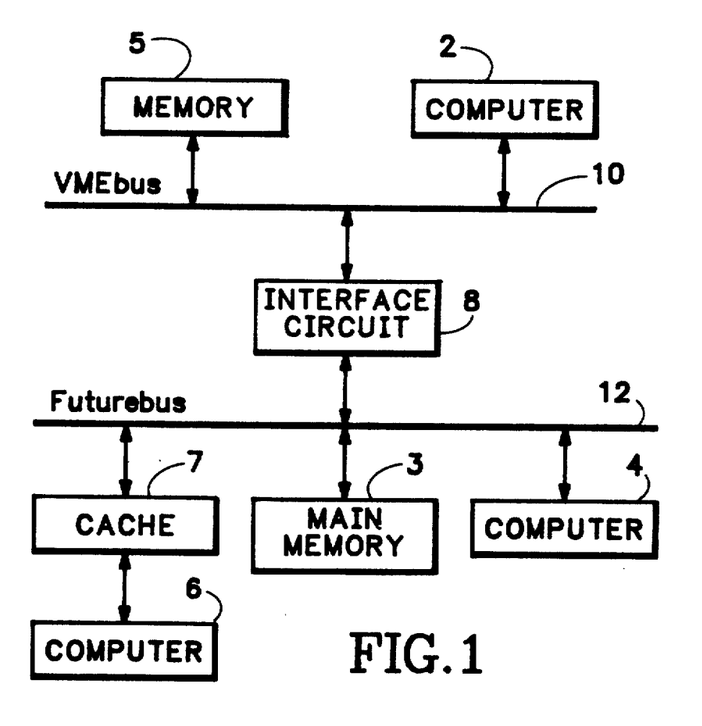
FIG. 1 is a block diagram illustrating a bus interface circuit in accordance with the present invention interconnecting dissimilar buses.

Referring to FIG. 1, the preferred embodiment of the present invention relates to a circuit 8 for interfacing a VMEbus 10 to a Futurebus 12. Interface circuit 8 permits a device such as a computer 2 connected to VMEbus 10 to read and write access an addressable main memory 3 or other addressable device connected to Futurebus 12. The interface circuit 8 maps a portion of VMEbus address space onto a portion of Futurebus address space so that when computer 2 read or write accesses selected addresses on the VMEbus, the interface circuit 8 implements the read or write access on corresponding addresses in a device on Futurebus 12 such as main memory 3. The interface circuit 8 also maps a portion of Futurebus address space onto a portion of VMEbus address space so that when a device such as computer 4 connected to Futurebus 12 reads or write accesses a selected Futurebus address, the interface circuit 8 read or write accesses a corresponding address of a device on Futurebus 12, for example, a memory 5. Computer 4 or 6 can adjust the VMEbus-Futurebus and Futurebus-VMEbus mapping by writing mapping data to the interface circuit 8. However, once the mapping relations are established, the operation of interface circuit 8 is transparent to devices on both buses.

Figure 2:
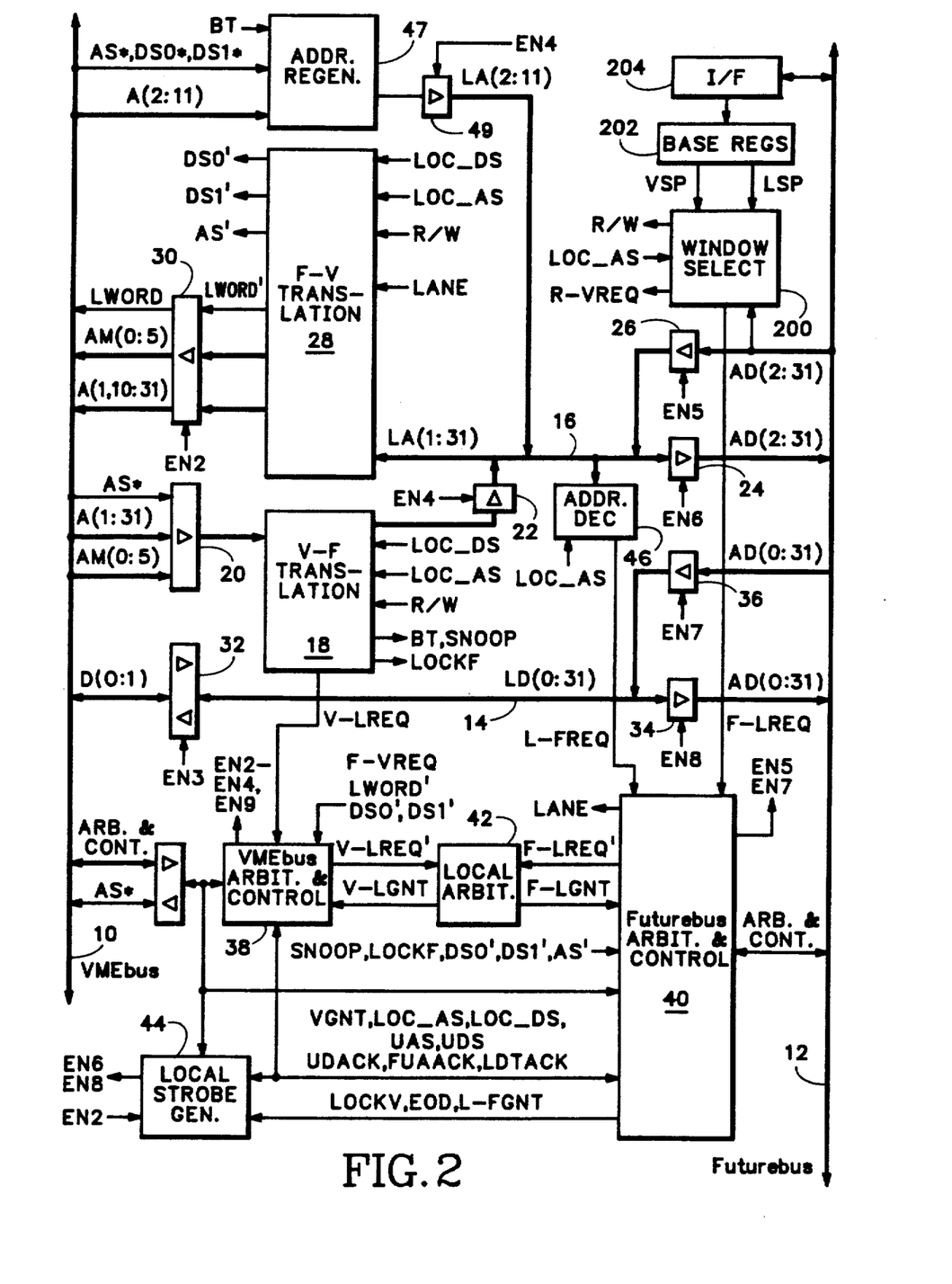
FIG. 2 is a block diagram illustrating the interface circuit of FIG. 1 in more detail.

FIG. 2 illustrates interface circuit 8 of FIG. 1 in more detailed block diagram form. Bidirectional local data bus 14 and local address bus 16 transfer data and translated addresses between VMEbus 10 and Futurebus 12. When a device on Futurebus 12 seeks to read or write access an address mapped to VMEbus address space, a buffer 26 selectively forwards the Futurebus address onto the local address bus 16. A Futurebus-to-VMEbus (F-V) translation circuit 28 then translates bits LA(25:31) of the local address to bits A1 and A(25:31) of a corresponding VMEbus address. A buffer 30 selectively places bits LA(2:24) of local address bus 16 and bits A1 and A(25:31) produced by F-V translation circuit 28 on the VMEbus 10 as address bits A(1:31). The F-V translation circuit 28 also generates the LWORD* and AM(0:5) control bits carried on VMEbus 10 with the address. (The * symbol following a VMEbus control signal name indicates the signal is low true, i.e., driven low when asserted.) As discussed in more detail hereinbelow, the LWORD* bit, in combination with other VMEbus control and address bits (DS0*, DS1*, and A1) indicates which of four byte locations are accessed during a data transfer. The AM (address modifier) bits are used to broadcast information such as address size and bus cycle type.

When a device on VMEbus 10 seeks to read or write access an address mapped to Futurebus address space, a VMEbus-to-Futurebus (V-F) translation circuit 18, coupled to VMEbus 10 by a buffer 20, translates the upper portion A(12:31) to a corresponding upper portion of the Futurebus bus address, and a buffer 22 selectively places this portion of the Futurebus address on local address bus 16. An address generator 47 forwards a lower portion A(2:11) of the VMEbus address to local address bus 16 as a corresponding lower portion of the Futurebus address. (As discussed hereinbelow, address generator 47 increments the Futurebus address during block transfer operations.) A buffer 24 selectively moves the 30-bit translated address from the local address bus 16 to lines AD(2:31) of Futurebus 12 during Futurebus address cycles.

Regardless of whether the device initiating the read or write operation is on the Futurebus or the VMEbus, when data is to flow from VMEbus 10 to Futurebus 12, a bi-directional buffer 32 conveys the data from the VMEbus to local data bus 14. A buffer 34 then moves the data on local data bus 14 to Futurebus 12. Alternatively, when data is to flow from Futurebus 12 to VMEbus 10, a buffer 36 couples the appropriate lines of Futurebus 12 to local data bus 14. The data then passes from local data bus 14 to VMEbus 10 by way of buffer 32.

The interface circuit 8 includes VMEbus arbitration and control circuit 38, suitably comprising a Mizar model VME1000 VMEbus arbitration circuit and a Signetics model 68172 VMEbus protocol controller. The VMEbus arbitration and control circuit 38 carries out conventional VMEbus arbitration and control functions permitting other devices on the VMEbus 10 to access the interface circuit 8 and permitting the interface circuit 8 to access other devices on VMEbus 10. Similarly, Futurebus arbitration and control circuit 40 carries out conventional Futurebus arbitration and control operations to permit devices connected to Futurebus 12 to access the interface circuit 8 and to permit the interface circuit 8 to access other devices on Futurebus 12. A "local" arbitration circuit 42, suitably a Signetics model 74F786 arbiter, arbitrates competing demands from VMEbus and Futurebus arbitration and control circuits for access to the local data and address buses 14/16. A local strobe generator 44 provides logic required to coordinate operations of VMEbus arbitration and control circuit 38 with Futurebus arbitration and control circuit 40.

When a bus master connected to VMEbus 10 seeks to write or read access an address on the VMEbus that has been mapped to a Futurebus address, the bus master arbitrates for control of VMEbus 10 and then places the address on VMEbus lines A(1:31), the address modifier on lines AM(0:5) and the data on lines D(0:31). The VMEbus address and address modifiers, along with the VMEbus address strobe AS*, pass through buffer 20 to V-F translation circuit 18.

Figure 3:
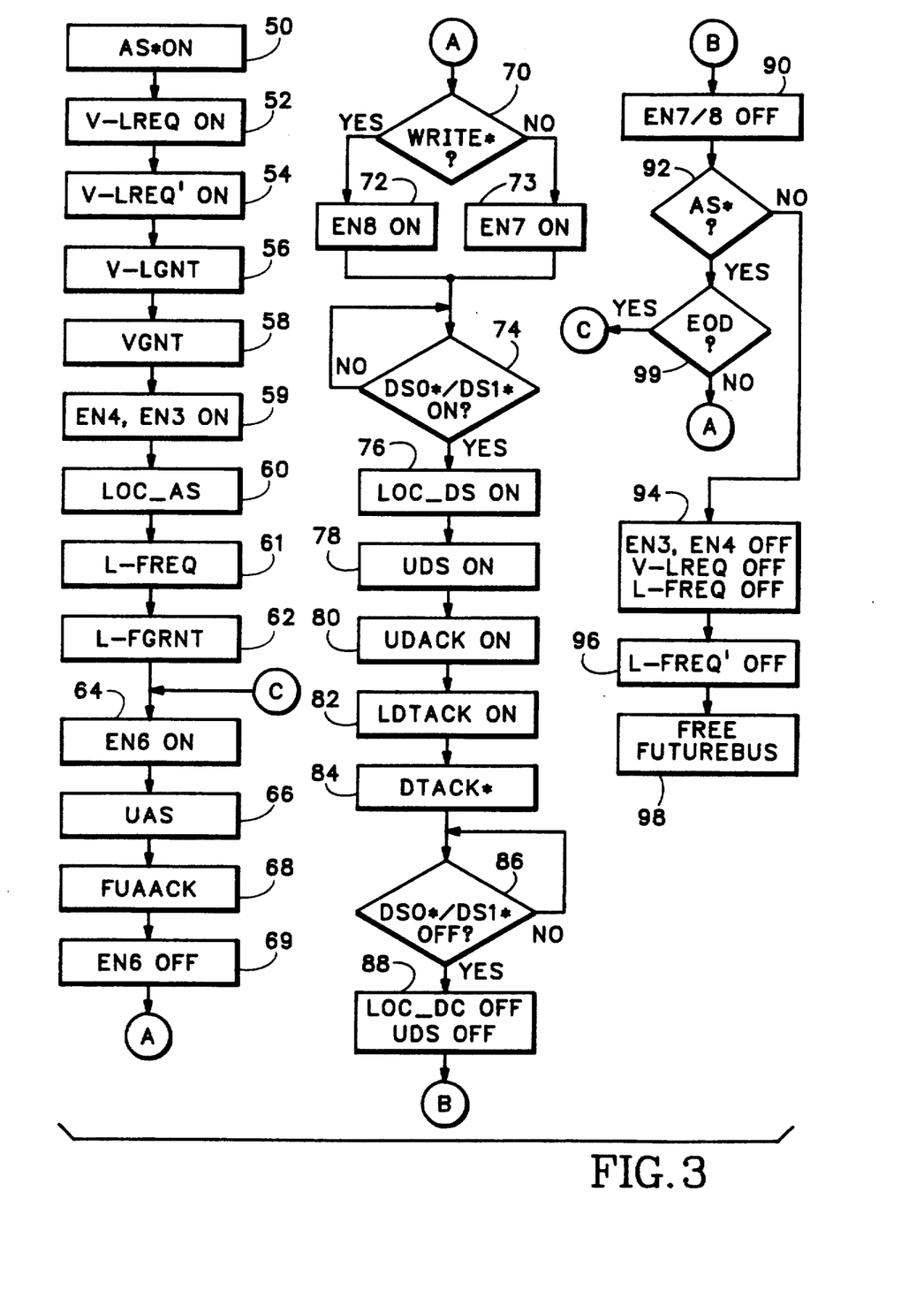
FIG. 3 is a signal flow chart illustrating how the interface circuit of FIG. 2 responds when a VMEbus bus master attempts to access a VMEbus address that has been mapped to a Futurebus address.

FIG. 3 is a signal flow chart illustrating how interface circuit 8 responds when (at step 50) the bus master asserts the AS* signal to indicate a valid address is on VMEbus 10. Referring to FIGS. 2 and 3, upon detection of AS*, V-F translation circuit 18 determines whether the VMEbus address has been mapped to a corresponding Futurebus address, and if so, transmits a request signal V-LREQ to VMEbus arbitration and control circuit 38 (step 52). In response, VMEbus arbitration and control circuit 38 asserts a V-LREQ' request signal input to local arbitration circuit 42 (step 54). When the local bus is available, local arbitration circuit 42 returns a grant signal V-LGNT to VMEbus arbitration and control circuit 38 (step 56). Control circuit 38 then asserts a VGNT signal (step 58) and asserts enable signals EN4 and EN3 (step 59). Signal EN4 causes buffer 22 to place the upper bits of a translated address output of V-F translation circuit 18 on local address bus 16 and causes buffer 49 to place the lower address bits provided by address generator 47 on the local address bus. Enable signal EN3 causes buffer 32 to connect the VMEbus data lines to local data bus 14. The VGNT signal causes local strobe generator 44 to assert a local address strobe signal LOC_AS (step 60). Local address decoder 46 checks the address on local address bus 16 and upon detection of the LOC_AS address strobe signal, transmits a request signal L-FREQ to Futurebus arbitration and control circuit 40 (step 61).

When Futurebus arbitration and control circuit 40 detects concurrent assertion of LOC_AS and L-FREQ and the Futurebus is available, circuit 40 gains control of Futurebus 12 and transmits an L-FGNT signal to local strobe generator 44 (step 62). Local strobe generator 44 then asserts an EN6 signal (step 64) causing buffer 24 to move the address on local address bus to Futurebus 12. Thereafter, local strobe generator 44 asserts another strobe signal UAS (step 66). Futurebus arbitration and control circuit 40 responds by completing a Futurebus address cycle and returning an acknowledge signal FUAACK to local strobe generator 44 (step 68). Local strobe generator 44 then deasserts EN6 (step 69) to turn off buffer 24. The VMEbus WRITE* control signal, indicating whether the bus master intends a read or write access, is forwarded to both local strobe generator 44 and Futurebus arbitration and control circuit 40. If the WRITE* signal is asserted, it indicates a write operation (step 70). Futurebus arbitration and control circuit 40 turns on an enable signal EN8 (step 72) causing buffer 34 to connect the local data bus 14 to the data/address lines of Futurebus 12. If the WRITE* signal is not asserted, a read operation is intended and Futurebus arbitration and control circuit 40 turns on an enable signal EN7 (step 73) causing buffer 36 to connect the local data bus 14 to the data/address lines of Futurebus 12. Local strobe generator 44 waits until the VMEbus master asserts the DS0* or DS1* data strobe (step 74). (In a write operation, this indicates valid data is on the VMEbus, and in a read operation, this indicates the bus master is ready for data.) Local strobe generator 44 then asserts the local data strobe LOC_DS (step 76) and a UDS strobe signal (step 78). Futurebus arbitration and control circuit 40 responds by completing a Futurebus data read or write cycle and then asserting a UDACK signal (step 80) and LDTACK (step 82). VMEbus arbitration and control circuit 38 responds to LDTACK by asserting the VMEbus data acknowledge signal DTACK* (step 84). Local strobe generator 44 waits until the VMEbus master turns off DS0* or DS1* (step 86) and then turns off LOC_DS and UDS (step 88). Futurebus arbitration and control circuit 40 responds by turning off the currently on EN7 or EN8 signal, thereby disconnecting local data bus 14 from Futurebus 12 (step 90).

VMEbus arbitration and control circuit 38, V-F translation circuit 18 and local address decoder 46 determine whether the VMEbus bus master is still asserting the AS* signal (step 92). If not, VMEbus arbitration and control circuit 38 frees VMEbus 10 and deasserts EN3 and EN4, V-F translation circuit 18 drops V-LREQ and local address decoder 46 drops L-FREQ (step 94). When VMEbus arbitration and control circuit 38 detects V-F translation circuit 18 has dropped L-FREQ, it drops V-LREQ' (step 96). Futurebus arbitration and control circuit 40 responds to deassertion of L-FREQ by freeing the Futurebus (step 98).

A bus master on VMEbus 10 may wish to perform a "block transfer" wherein it read or write accesses a variable number of up to 256 data bytes at successive addresses on Futurebus 12. For a block transfer, the bus master sets the address modifier bits to indicate a block transfer and continuously asserts the address strobe AS* while repetitively asserting and deasserting the appropriate data strobes DS0*/DS1*. For a block write, each successive data strobe indicates when the bus master has placed a new data word on the bus. For a block read, successive data strobes indicate when the bus master is ready to receive data words from the slave. The bus slave reads or writes the first data at the address appearing on VMEbus 10 when a data strobe is first asserted. Thereafter, in response to successive assertions of the data strobe, the slave successively stores or reads out data at successive addresses and asserts a data acknowledge signal on VMEbus 10. For either a read or a write block transfer, the bus slave generates the necessary addressing internally. The block transfer terminates when the bus master deasserts the address strobe.

Futurebus 12 also permits a block transfer mode, but Futurebus slaves for the purposes of cache coherence can handle block transfers of only a small fixed number of data words. When a Futurebus slave has reached its limit, it transmits an end of data signal EOD to the Futurebus master. If the Futurebus master wishes to read or write more data, it must initiate another block transfer.

Referring to FIG. 2, the interface circuit 8 includes a generator 47 connected to VMEbus 10 for receiving bits A(2:11) of the VMEbus address, along with the address and data strobes, AS*, DS0* and DS1* and a BT bit indicating when a block transfer is in progress. When the AS* strobe is asserted, address generator 47 stores and outputs address bits A(2:11) to buffer 49. Buffer 49 places these bits on the local address bus 16 in response to the EN4 signal. (The remaining bits of the local address bus are supplied by V-F translation circuit 18 through buffer 22.) If the block transfer bit BT is asserted, address generator 47 increments bits LA(2:9) whenever one of the data strobes DS0*/DS1* is asserted.

Thus during a block transfer operation, the VMEbus bus master continues to assert the AS* signal after DTACK* and Futurebus arbitration and control circuit 40 detects AS* at step 92 of FIG. 3. Thereafter, if EOD bit is not true (step 99), another data read or write operation is executed per steps 70-92. When at step 99 Futurebus arbitration and control circuit 40 detects the EOD signal, interface circuit 8 operation reverts to step 64 where local strobe generator 44 reasserts EN6 to place an updated address on Futurebus 12. Thereafter, a write or read operation is repeated by the appropriate steps 66–92. The block transfer continues in a similar manner until Futurebus arbitration and control circuit 40 detects AS* is deasserted at step 90. The interface circuit then proceeds through steps 94–98 as discussed hereinabove to complete the block transfer and free Futurebus 12.

Figure 4:
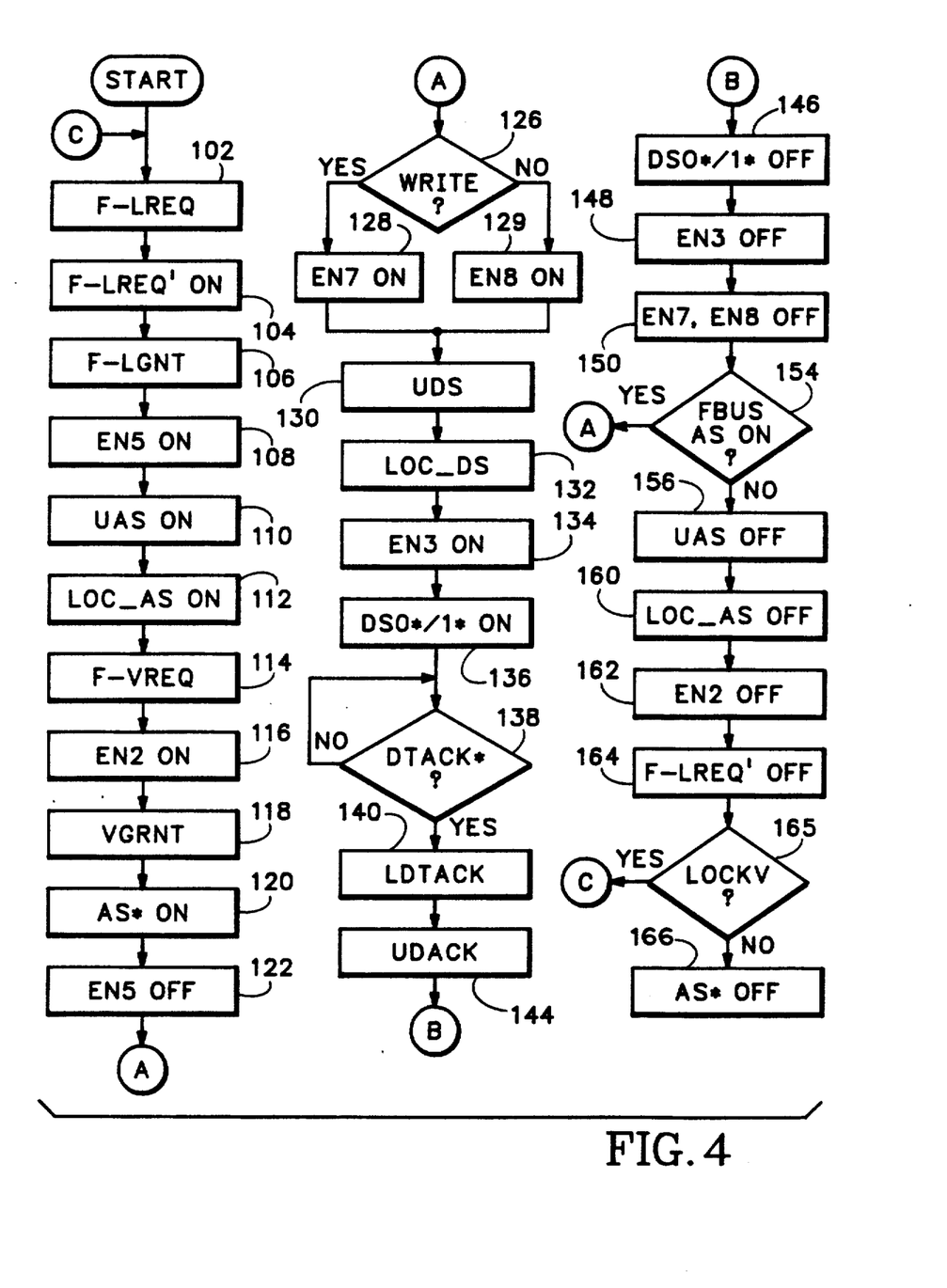
FIG. 4 is a signal flow chart illustrating how the interface circuit of FIG. 2 responds when a Futurebus bus master attempts to access a Futurebus address that has been mapped to a VMEbus address.

FIG. 4 is a signal flow chart illustrating how the interface circuit 8 responds. Referring to FIGS. 2 and 4, when a bus master connected to Futurebus 12 seeks to write or read access a Futurebus address that has been mapped to VMEbus 10, the bus master arbitrates for control of Futurebus 12 and places the address AD(2:31) on Futurebus 12. Window select circuit 200 compares upper bits of the Futurebus address to a data value VSP stored a base register 202 to determine whether the Futurebus address is mapped onto VMEbus 10. If so, the window select circuit 200 transmits a request signal F-LREQ to Futurebus arbitration and control circuit 40 (see step 102 of FIG. 4). Futurebus arbitration and control circuit 40 then turns on an F-LREQ' signal to local arbitration circuit 42 to request access to the local bus (step 104). When the local bus is free, local arbitration circuit 42 returns an F-LGNT signal to Futurebus arbitration and control circuit 40 (step 106). Futurebus arbitration and control circuit 40 responds by asserting an enable signal EN5 (step 108) to turn on buffer 26 which places the Futurebus address on local data bus 16. Futurebus arbitration and control circuit 40 also asserts the UAS strobe (step 110). Local strobe generator 44 responds to the UAS strobe by asserting LOC_AS (step 112). In the meantime, F-V translation circuit 28 translates the Futurebus address on local address bus 16 to a corresponding VMEbus address A(1:31), appropriate address modifier bits AM(0:5) and an appropriately set LWORD* bit. When window select circuit 200 detects LOC_AS, it transmits an F-VREQ signal to VMEbus arbitration and control circuit 38 (step 114). VMEbus arbitration and control circuit 38 thereupon arbitrates for control of VMEbus 10 and thereafter asserts the EN2 signal (step 116). VMEbus arbitration and control circuit 38 responds by sending a VGNT signal to local strobe generator 44 (step 118) causing buffer 30 to place the VMEbus address, address modifier and LWORD* outputs of F-V translation circuit 28 on VMEbus 10. Futurebus arbitration and control circuit 40 in turn asserts the VMEbus address strobe signal AS* (step 120) and then deasserts EN5 (step 122) to turn off buffer 26.

Futurebus arbitration and control circuit 40 checks control signals on Futurebus 12 to determine if a write operation is intended (step 126), and if so, circuit 40 turns on enable signal EN7 (step 128), causing buffer 36 to connect the Futurebus address/data lines to local data bus 14. If a read operation is indicated at step 126, circuit 40 turns on enable signal EN8 to activate buffer 34 (step 129). When circuit 40 then determines valid data is on Futurebus 12, it asserts the UDS signal (step 130). Local strobe generator 44 responds to the UDS signal by asserting the local data strobe LOC_DS (step 132), causing VMEbus arbitration and control circuit 38 to assert the EN3 signal (step 134) so that buffer 32 places the data on the Futurebus data lines and to assert the appropriate VMEbus data strobe signals DS0* and/or DS1* (step 136) for length and byte position of the data word being transferred. When the slave device on VMEbus 10 detects the DS0*/DS1* assertion and has received the data, it asserts a data acknowledge signal DTACK*. VMEbus arbitration and control circuit 38 waits for DTACK* (step 138). It then sends an acknowledge signal LDTACK to Futurebus arbitration and control circuit 38 (step 140). Futurebus arbitration and control circuit 40 completes the Futurebus data cycle and asserts the UDACK signal (step 144). VMEbus arbitration and control circuit 38 turns off DS0* or DS1* (step 146) and enable signal EN3 (step 148) to signal completion of the VMEbus data cycle and to disconnect the local data bus 14 from the VMEbus 10. At the same time, Futurebus arbitration and control circuit 40 turns off the appropriate EN7 or EN8 signal to disconnect the local data bus 14 from the Futurebus 12 (step 150).

Futurebus arbitration and control circuit 40 checks the Futurebus address strobe signal to determine whether more data is to be sent. If so, Futurebus arbitration and control circuit 40 returns to step 126 to carry out another data read or write cycle. If at step 154 the Futurebus address strobe has been released, Futurebus arbitration and control circuit 40 turns off UAS (step 156). Local strobe generator 44 then turns off LOC_AS (step 160). When LOC_AS turns off, VMEbus arbitration and control circuit 38 turns off EN2 to disable buffer 30 (step 162) and Futurebus arbitration and control circuit 40 deasserts F-LREQ' (step 164) to indicate to local arbitration circuit 42 that Futurebus arbitration and control circuit 40 no longer needs the local bus. Local strobe generator 44 checks whether Futurebus arbitration and control circuit 40 is asserting a LOCKV signal (step 165), and if not, Futurebus arbitration and control circuit 40 deasserts the VMEbus address strobe AS* (step 166) to signal release VMEbus 10. However, if at step 165 Futurebus arbitration and control circuit 40 is asserting the LOCKV signal, indicating the Futurebus bus master has locked Futurebus 12, circuit 40 continues to assert AS* so that the interface circuit does not release VMEbus 10. Interface circuit operation returns to step 102. This, for example, enables the Futurebus master to carry out a read/modify/write operation on a data value stored at some location on VMEbus 10.

Figure 5:
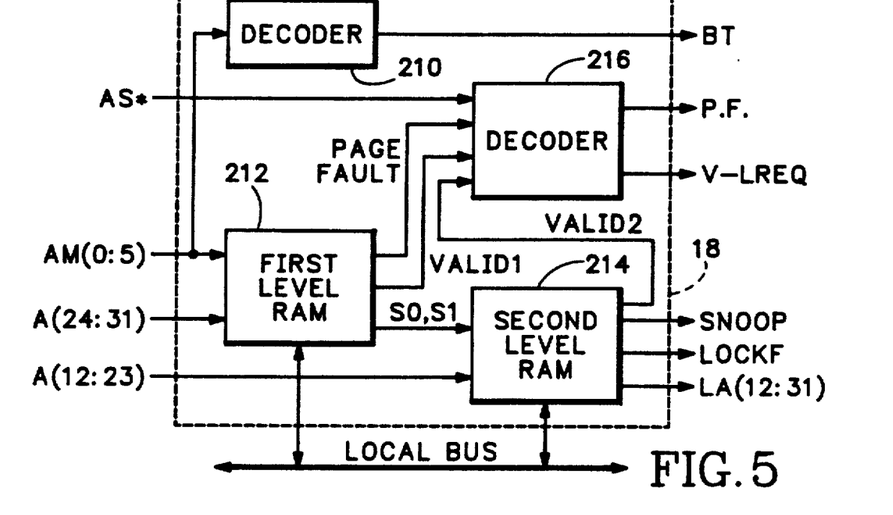
FIG. 5 is a block diagram illustrating the V-F translation circuit of FIG. 2 in more detail.
Figure 6:
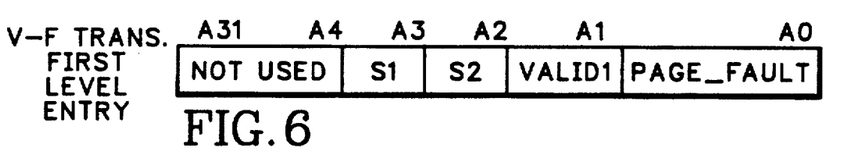
FIG. 6 illustrates the data word stored at each location in a random access memory within the V-F translation circuit of FIG. 5.
Figure 7:
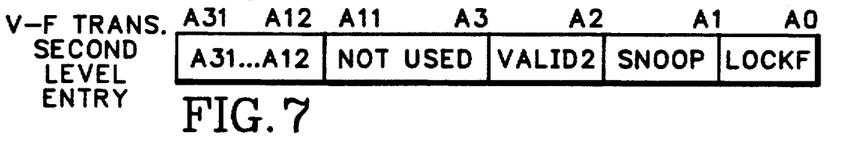
FIG. 7 illustrates the data word stored at each location in another random access memory within the V-F translation circuit of FIG. 5.

FIG. 5 illustrates V-F translation circuit 18 of FIG. 2 in more detailed block diagram form. Referring to FIG. 5, V-F translation circuit 18 includes a decoder 210 that generates the block transfer bit BT in response to combinations of VMEbus address modifier bits indicating block transfer mode. The BT bit tells address generator 47 of FIG. 2 when it should increment addresses in response to the VMEbus data strobe. A "first level" RAM 212 has as addressing input the address modifier bits AM(0:5) and bits A(24:31) of the VMEbus address. A "second level" RAM 214 has as addressing input two output bits S0 an S1 of RAM 212 and VMEbus address bits A(12:23). Translation data is written into RAMS 212 and 214 via the local bus in a manner described hereinbelow. FIG. 6 illustrates the data word stored at each location in RAM 212 and FIG. 7 illustrates the data word stored at each location of RAM 214. Bits S0 and S1 of RAM 214 select one of four second level maps. Bits D(12:31) of RAM 214 provide local address bits LA(12:31). Bits 0 and 1 of the RAM 212 data word are "PAGE_FAULT" and "VALID1" bits and bit "VALID2" of RAM 212 may be used to supply primitives for a software implemented virtual memory scheme. These three bits are decoded by a decoder 216 in response to the VMEbus address strobe AS*. When VALID1 and VALID2 are true and PAGE_FAULT is false, decoder 216 generates the V-LREQ signal. If PAGE_FAULT is true, decoder 216 generates a PF signal indicating the VMEbus bus master is attempting to access an invalid memory area. The PF signal tells Futurebus arbitration and control circuit 40 of FIG. 2 to interrupt a computer on the Futurebus and provide it with a VMEbus page fault indication so that the Futurebus computer can take appropriate action. The LOCKF output bit of V-F translation circuit 18 of FIG. 2 is stored as bit A0 stored RAM 214 of FIG. 5.

Referring to FIG. 2, V-F translation circuit 18 generates the LOCKF signal in response to predetermined combinations of VMEbus address modifier and address signals. The LOCKF signal tells Futurebus arbitration and control circuit 40 not to permit other devices on the Futurebus to arbitrate for the Futurebus and to signal a "LOCK" Futurebus transfer mode to other devices on the Futurebus. The LOCK mode is thereafter released whenever the VMEbus master writes to the Futurebus or whenever the L-FREQ signal is deasserted following deassertion of the VMEbus address strobe AS*. The LOCKF bit is typically asserted to lock Futurebus 12 for a read/modify/write operation wherein the bus master seeks to read data from a particular Futurebus address, modify the data and then write it back to the same Futurebus address. In typical operation, LOCKF may be stored in every memory location within one portion of RAM 214 accessed when the S0,S1 output bits of RAM 212 are of a particular combination of states set in response to address modifier AM(0:5) bits indicating a read/modify/write operation.

Referring to FIG. 1, a computer 6 on Futurebus 12 may copy a block of data from an area of low speed main memory 3 into a higher speed cache memory 7 and thereafter read and write access the data in the cache memory 7 rather than in main memory 3. If another device on Futurebus 12 such as interface circuit 8 subsequently read accesses the same area of main memory 3, data read may be "obsolete" because it was not updated when corresponding data stored in cache memory 7 was updated. Also, if another device on Futurebus 12 writes data to that area of main memory 3, corresponding data in cache memory 7 becomes obsolete.

To ensure cache coherency, when computer 4 seeks to read access a main memory 3 address, it may assert a SNOOP signal on Futurebus 12 during the address cycle. If any other device on Futurebus 12 such as computer 6 is maintaining a cache for data stored at that memory address, computer 6 may assert a "RETRY" signal which causes computer 4 to relinquish control of Futurebus 12 before completing the address cycle. At that point, computer 6 obtains control of Futurebus 12 and writes the appropriate data from cache memory 7 back into main memory 3. Thereafter, when computer 4 repeats the address cycle, computer 6 ignores the SNOOP signal and permits computer 4 to complete both address and data cycles. Computer 6 carries out the same actions when computer 4 attempts to write access data in main memory 3 for which computer 6 is maintaining a cache. However, once computer 4 has completed the write access, computer 6 reads the new data out of main memory 3 and stores it in cache memory 7 to maintain cache coherency.

Referring to FIG. 2, V-F translation circuit 18 may assert a SNOOP signal when generating any particular Futurebus address to indicate whether a "snoop" operation should be performed on Futurebus 12 in order to maintain Futurebus cache coherency. Futurebus arbitration and control circuit 40 places the SNOOP signal on Futurebus 12 and responds appropriately in response to retry requests from cache master on the Futurebus. Referring to FIGS. 2, 5 and 7, the SNOOP signal output of V-F translation circuit 18 of FIG. 2 is controlled by bit D1 stored in RAM 214. As discussed hereinbelow, a device on Futurebus 12 can write access the data in each RAM 214 memory location, not only to adjust VMEbus-Futurebus address translation, but also to set appropriately the SNOOP signal state when a snoop operation is needed.

Figure 8:
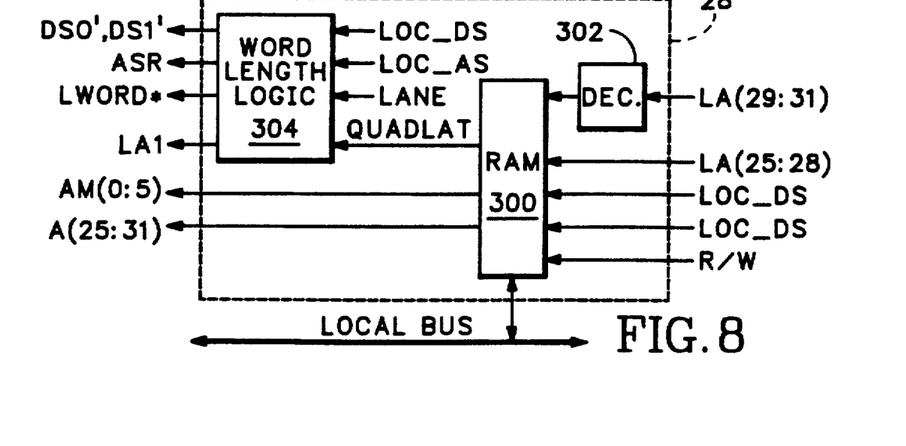
FIG. 8 illustrates F-V translation circuit 28 of FIG. 2 in more detailed block diagram form.
Figure 9:
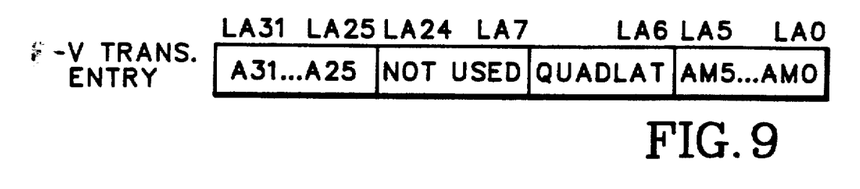
FIG. 9 illustrates the data word stored at each location in a random access memory within the F-V translation circuit of FIG. 8.

FIG. 8 illustrates F-V translation circuit 28 of FIG. 2 in more detailed block diagram form. F-V translation circuit 28 includes a RAM 300 having local address bits LA(25:28) as addressing input. As illustrated in FIG. 9, RAM 300 stores and reads out VMEbus address modifier bits AM(0:5), address bits A(25:31) and a "QUADLET" bit. The translation data is written into RAM 300 via the local data bus in a manner described hereinbelow. A decoder 302 transmits a read enable signal to RAM 300 in response to a particular combination of local address bits LA(29:31). The QUADLET bit output of RAM 300, LANE select bits from Futurebus arbitration and control circuit 40 of FIG. 2 (indicating the length and position on Futurebus 12 of the data word to be transmitted between Futurebus 12 and VMEbus 10), and the local address and data strobe signals LOC_AS and LOC_DS provide inputs to a word length logic circuit 304. The QUADLET bit may be set to indicate the word length is 32 bits (a "long word"). Circuit 304 generates appropriately set DS0', DS1', AS', LWORD* and A1' bits based on states of its inputs. The DS0' and DS1' bits tell circuit 38 what states to set DS0* and DS1*. (DS0*, DS1*, LWORD* and A1 collectively indicate which data byte positions are accessed during a data transfer.) The AS' signal tells circuit 38 when the VMEbus address strobe signal AS* may be asserted.

Control data transmitted by the Futurebus master during the Futurebus data cycle indicates the length and byte position of words to be accessed, and in response, Futurebus arbitration and control circuit 40 transmits the LANE data conveying this information to circuit 304 of FIG. 8. Since the VMEbus slave determines the length and byte position of data transmission in part by the LWORD* and A1 bits that appear on the VMEbus when the address strobe signal AS* is asserted, circuit 38 may have to delay assertion of AS* until the Futurebus data cycle. Specifically, if the QUADLET bit output of F-V translation circuit 28 is not set, circuit 304 of FIG. 8 determines the appropriate states for A1, DS0', DS1' and LWORD* based on the LANE data produced by Futurebus arbitration and control circuit 40 during the Futurebus data cycle and waits until local strobe generator 44 asserts LOC_DS before it sends the AS' signal to circuit 38. In such case, the VMEbus address strobe AS* is turned on following step 132 of FIG. 4 instead of following step 118 as shown. This delay in asserting AS* slows down VMEbus operation because the VMEbus slave must wait longer to acquire and inspect the address bits.

However, if it is known that all data stored in a particular portion of VMEbus address space is in 32 bit (long word) form, the QUADLET bit may be set in storage locations of RAM 300 corresponding to that portion of VMEbus address space. When the QUADLET is set, circuit 304 sets A1, DS0', DS1' and LWORD* to indicate a 32 bit data transmission and asserts the AS' immediately on detection of the local address strobe LOC_AS. The AS' signal tells circuit 38 that AS* should be immediately asserted after VGNT at step 120, as shown in FIG. 4, without waiting for the Futurebus data cycle.

A device connected to Futurebus 12 can alter mapping and other data stored in RAMs 212 and 214 of FIG. 5 or stored in RAM 300 of FIG. 8. Referring to FIGS. 2 and 5, data storage locations in RAMs 212 and 214 are mapped to Futurebus addresses within a range determined by a data value LSP stored in a base register 202. (Base registers 202 themselves are mapped to fixed Futurebus addresses, and a Futurebus device may adjust both VSP and LSP data in base registers 202 by write accessing these registers through conventional Futurebus interface circuit 204.)

Figure 10:
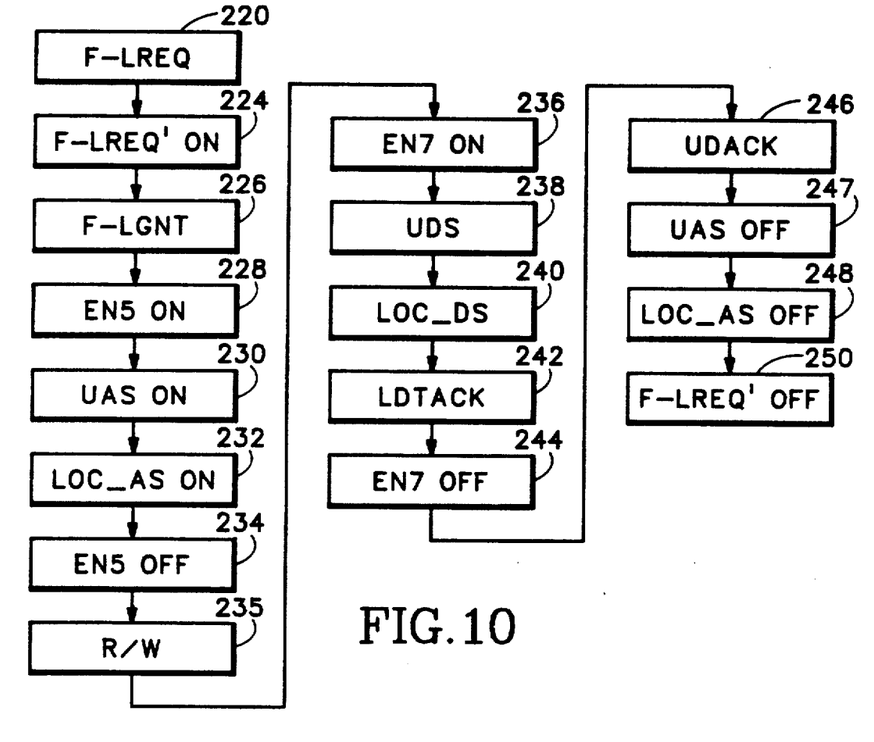
FIG. 10 is a signal flow diagram illustrating how the interface circuit of FIG. 7 responds when Futurebus bus master writes mapping data into the interface circuit.

As illustrated in FIG. 10, when window select circuit 200 detects the address on Futurebus 12 is within the range indicated by LSP, it transmits the F-LREQ signal to Futurebus arbitration and control circuit 40 (step 220). Futurebus arbitration and control circuit 40 responds to F-LREQ by sending an F-LREQ' signal to local arbitration circuit 42 (step 222). When the local bus is available, local arbitration circuit 42 returns the F-LGNT signal (step 226). Futurebus arbitration and control circuit 40 then asserts EN5 (step 228) to turn on buffer 26 and asserts the UAS strobe signal (step 230). Local strobe generator 44 then asserts LOC_AS (step 232), causing the various addressable devices on interface circuit 8, including V-F translation circuit 18 and F-V translation circuit 28, to acquire the address on local address bus. Futurebus arbitration and control circuit 40 then turns off EN5 (step 234) and sets a read-/write signal R/W supplied to V-F translation circuit 18 to indicate a write operation (step 235). Circuit 40 also turns on EN7 to connect Futurebus 12 to local data bus 14 via buffer 36 (step 236), and asserts the UDS strobe (step 238) when valid data is on Futurebus 12. Local strobe generator 44 responds to UDS by asserting LOC_DS (step 240), thereby causing one of the RAMs to store the data at the address appearing on the local address bus when the LOC_AS strobe was last asserted. Local strobe generator 44 turns off EN7 (step 244) and then asserts UDACK (step 246). Circuit 40 then turns off UAS (step 247). Local strobe generator 44 responds by turning off LOC_AS (step 248). Futurebus arbitration and control circuit 40 then turns off F-LREQ' to release the local bus (step 250). A device connected to Futurebus 12 can alter data stored in RAM 300 of FIG. 8 following a similar procedure.

Figure 11:
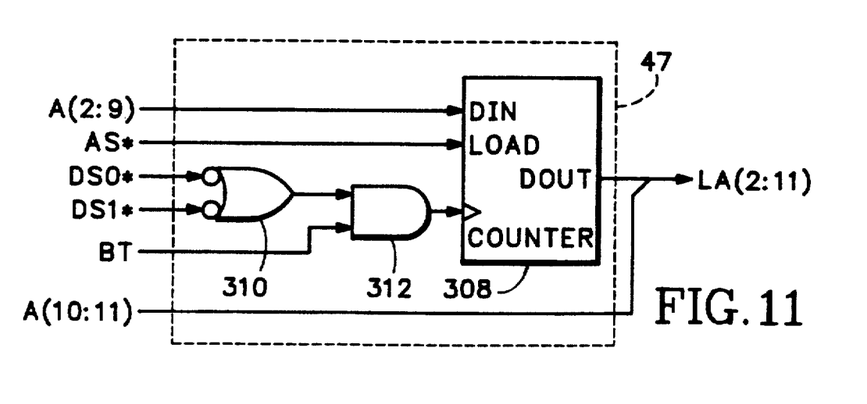
FIG. 11 illustrates the address generator circuit of FIG. 2 in more detailed block diagram form.

FIG. 11 illustrates address generator 47 of FIG. 2 in more detailed block diagram form. Address generator 47 includes a programmable counter 308 that stores and outputs VMEbus address bits A(2:9) as local bus address bits LA(2:9) when the VMEbus address strobe signal is asserted. VMEbus address bits A(10:11) directly control local address bits LA(10:11). The DS0* and DS1* signals are applied to inverting inputs of an OR gate 310. The output of OR gate 310 and the block transfer bit BT produced by V-F translation circuit 18 control inputs of an AND gate 312. The output of AND gate 312 clocks counter 308 on the leading edge of DS0* or DS1* during block transfers so that local address bits LA(2:9) are incremented during each VMEbus data cycle.

Thus, as described hereinabove, a preferred embodiment of the bus interface circuit of the present invention provides data communication between a computer system using the VMEbus and another computer system using the Futurebus. The interface circuit includes a mapping circuit that maps each of a set of VMEbus addresses to corresponding Futurebus addresses. When a bus master on the VMEbus attempts to read or write access any one of the set of VMEbus addresses, the mapping circuit generates a corresponding Futurebus address and a SNOOP signal indicating whether the Futurebus address references a cached data storage location on the Future bus. The bus interface circuit then obtains control of the Futurebus and starts a read or write access cycle by placing the SNOOP signal and the generated address on the Futurebus. If the SNOOP signal indicates the Futurebus address references a cached data storage location, a processor on the Futurebus controlling the cache responds to the SNOOP signal with a retry signal. The bus interface circuit then relinquishes control of the Futurebus to permit the computer processor using the cache memory to write data from the cache into the storage location referenced by the generated Futurebus address. Thereafter, the interface circuit regains control of the Futurebus and completes a read or write access of that data storage location. The interface circuit also permits a computer processor on the Futurebus to write mapping data into the mapping circuit to selectively alter the Futurebus address and SNOOP signal state generated by the mapping circuit in response to any particular VMEbus address.

While the foregoing specification has described a preferred embodiment of the present invention, one skilled in the art may make many modifications to the preferred embodiment without departing from the invention in its broader aspects. The appended claims therefore cover all such modifications as fall within the true spirit and scope of the invention.

We claim:

1. An apparatus for providing data communication between first and second buses, the first bus providing a first plurality of bus masters connected thereto with data read and write access to first data storage locations mapped to separate addresses within a first address space, wherein one of said first plurality of bus masters writes data to a first particular one of said first data storage locations by placing on the first bus an address to which the first particular one of said first data storage locations is mapped and transmitting the data via said first bus, and wherein one of said first plurality of bus masters reads data from a second particular one of said first data storage locations by placing on the first bus an address to which the second particular one of said first storage locations is mapped and receiving data via said first bus, the second bus providing a second plurality of bus masters connected thereto with data read and write access to second data storage locations mapped to separate addresses within a second address space, wherein one of said second plurality of bus masters writes data to a first particular one of said second data storage locations by placing on the second bus an address to which the first particular one of said second data storage locations is mapped and transmitting the data via said second bus, and wherein one of said second plurality of bus masters reads data from a second particular one of said second data storage locations by placing on the second bus an address to which the second particular one of said second storage locations is mapped and receiving data via said second bus,
wherein one of said second plurality of bus masters connected to said second bus caches data read out of a subset of said second data storage locations, said second bus including means for conveying a SNOOP signal with an address appearing on the bus, the SNOOP signal telling said one of said second plurality of bus masters when to write cached data to the address appearing on the bus, the apparatus comprising:
first mapping means coupled to said first bus for mapping first addresses within the first address space to second addresses within the second address space, for asserting an indicating signal and for generating one of said second addresses in response to one of said first addresses transmitted on said first bus from one of said first plurality of bus masters, said first mapping means also generating a SNOOP signal of a state indicating when a generated second address is mapped to one of said particular subset of the second data storage locations, and
bus interface means connected to said first and second buses for responding to the first indicating signal when said one of said first plurality of bus masters is reading data by placing the generated second address and SNOOP signal on the second bus, receiving data from a second data storage location mapped to said second address, and transmitting the received data to said one of said first plurality of bus masters via said first bus when the said one of said first plurality of bus masters is reading data.

2. The apparatus in accordance with claim 1 wherein said first mapping means generates said second address and said SNOOP signal in accordance with adjustable address mapping and SNOOP data stored by said mapping means.

3. The apparatus in accordance with claim 2 wherein said bus interface means further comprises means permitting one of said second plurality of bus masters connected to the second bus to adjust said mapping data and said SNOOP data by write accessing a portion of said second address space via said second bus.

* * * * *